US006827788B2

(12) United States Patent
Takahashi

(10) Patent No.: US 6,827,788 B2
(45) Date of Patent: Dec. 7, 2004

(54) SUBSTRATE PROCESSING DEVICE AND THROUGH-CHAMBER

(75) Inventor: Nobuyuki Takahashi, Kanagawa-ken (JP)

(73) Assignee: Anelva Corporation, Fuchu (JP)

( * ) Notice: Subject to any disclaimer, the term of this patent is extended or adjusted under 35 U.S.C. 154(b) by 0 days.

(21) Appl. No.: 10/015,804

(22) Filed: Dec. 17, 2001

(65) Prior Publication Data

US 2002/0078892 A1 Jun. 27, 2002

(30) Foreign Application Priority Data

Dec. 27, 2000 (JP) ..................................... 2000-399442

(51) Int. Cl.$^7$ ............................ C23C 16/00; C23F 1/00
(52) U.S. Cl. ............. 118/719; 156/345.31; 156/345.32; 414/939; 204/298.25; 204/298.35
(58) Field of Search ....................... 204/298.25, 298.35; 414/936, 939; 156/345.54, 345.55; 118/719

(56) References Cited

U.S. PATENT DOCUMENTS

| | | | |
|---|---|---|---|
| 4,405,435 A | | 9/1983 | Tateishi et al. |
| 4,500,407 A | * | 2/1985 | Boys et al. ............. 204/298.25 |
| 4,643,629 A | * | 2/1987 | Takahashi et al. ...... 414/331.17 |
| 4,651,674 A | * | 3/1987 | Hayashi et al. .............. 118/728 |
| 4,813,846 A | * | 3/1989 | Helms ...................... 414/744.1 |
| 4,981,408 A | * | 1/1991 | Hughes et al. ............... 414/217 |
| 4,993,559 A | | 2/1991 | Cota |
| 5,288,329 A | | 2/1994 | Nakamura et al. |
| 5,379,984 A | | 1/1995 | Coad et al. |
| 5,738,767 A | * | 4/1998 | Coad et al. ............. 204/192.12 |
| 6,027,618 A | | 2/2000 | Aruga et al. |
| 6,083,566 A | * | 7/2000 | Whitesell ..................... 427/445 |
| 6,205,870 B1 | * | 3/2001 | Hosokawa et al. ......... 73/865.9 |
| 6,228,439 B1 | * | 5/2001 | Watanabe et al. ............ 427/585 |
| 6,251,191 B1 | * | 6/2001 | Matsuse ...................... 118/719 |
| 6,309,525 B2 | * | 10/2001 | Futagawa et al. ....... 204/298.11 |
| 6,315,879 B1 | * | 11/2001 | Washburn et al. ...... 204/298.25 |
| 6,336,546 B1 | | 1/2002 | Lorenz |
| 6,358,377 B1 | * | 3/2002 | Schloremberg et al. ...................... 204/192.12 |
| 6,451,181 B1 | * | 9/2002 | Denning et al. ........ 204/192.17 |
| 2002/0080291 A1 | | 6/2002 | Takahashi |

FOREIGN PATENT DOCUMENTS

| | | |
|---|---|---|
| JP | 06-069316 | 3/1994 |
| JP | 09-129569 A | 5/1997 |
| JP | 2000-177842 | 6/2000 |

* cited by examiner

*Primary Examiner*—Parviz Hassanzadeh
*Assistant Examiner*—Karla Moore
(74) *Attorney, Agent, or Firm*—Burns, Doane, Swecker & Mathis, L.L.P.

(57) ABSTRACT

A substrate 9 is carried by a carry system in sequence, via a direction-altering chamber 8 to which a plurality of vacuum chambers comprising processing chambers 21 to 24 are hermetically-connected in the perimeter, to the plurality of processing chambers 21 to 24. The carry system carries the substrate 9 horizontally by moving, using a horizontal moving mechanism, a substrate holder 92 which holds two substrate 9 upright in such a way that the plate surface thereof forms a holding angle to the horizontal of between 45° or more and 90° or less. The direction-altering chamber 8 includes a direction altering mechanism 80 that alters the direction of movement by the horizontal movement mechanism. The direction altering mechanism 80 alters the direction of movement by rotating the substrate holder 92 and the horizontal movement mechanism about the vertical rotating axis coincident with the center axis of the direction-altering chamber 8.

15 Claims, 10 Drawing Sheets

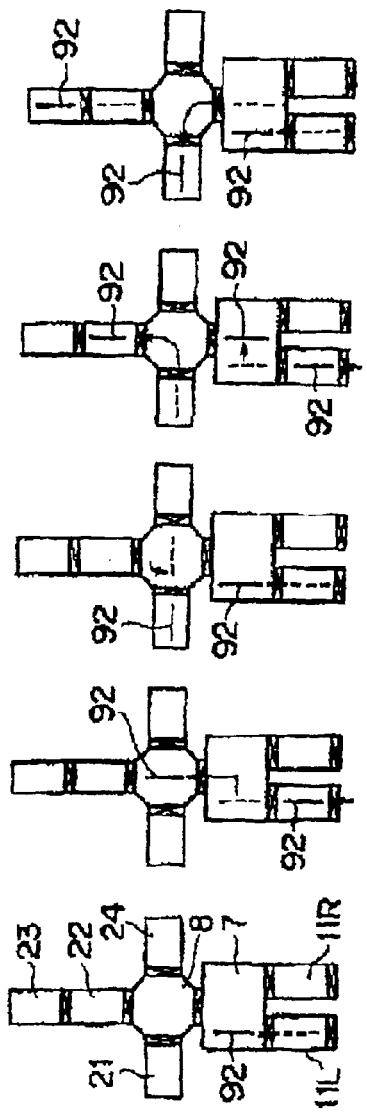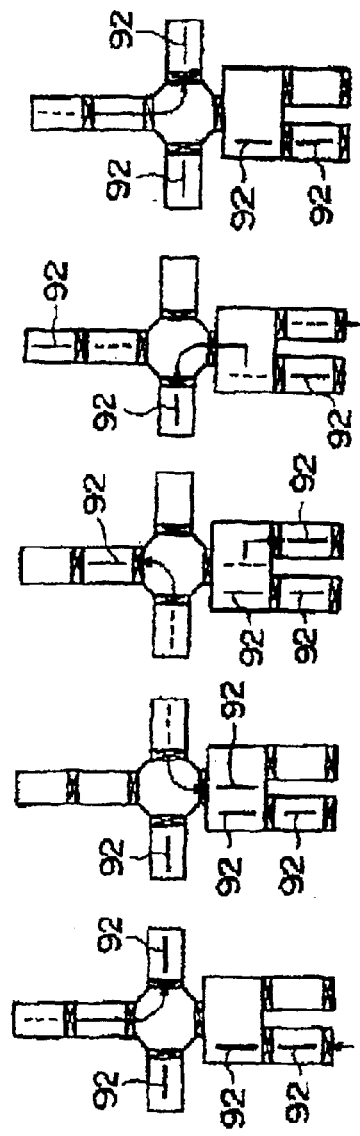

SUBSTRATE PROCESSING DEVICE AND THROUGH-CHAMBER

CROSS-REFERENCE TO RELATED APPLICATIONS

The present application claims the priority of JP 2000-399442 filed in Japan on Dec. 27, 2000, the entire contents of which are hereby incorporated herein by reference.

BACKGROUND OF THE INVENTION

1. Field of the Invention

The invention of the present application relates to a substrate processing device suitable for use in the manufacture of display devices such as liquid crystal displays.

2. Discussion of Related Art

In the manufacture of various display devices, such as liquid crystal displays and plasma displays, a process such as surface-processing must be administered on a plate-shaped material that forms the base of the device (hereinbelow referred to as the substrate). By way of example, in liquid crystal displays, a process to form a transparent electrode on the plate surface (surface that is not the peripheral surface) of the glass substrate is required.

The substrate processing device employed in the processing of this kind—because the processing of the substrate is performed in a predetermined atmosphere—comprises a chamber configured in such a way that it can be pumped out to a vacuum or a predetermined gas can be introduced to the inner space. As different processes are continuously performed therein and the pressure must be gradually lowered from atmospheric pressure, the configuration that is adopted comprises a plurality of chambers.

Substrate processing devices of the prior art such as this may, in terms of the layout of the chambers, be broadly divided into two types. One is known as the inline-type and the other is known as the cluster tool-type.

FIG. 9 shows the schematic configuration of a conventional inline-type substrate processing device. The inline-type device is a configuration in which a plurality of chambers 11, 2, 3 and 12 are longitudinally-provided in a straight line. A carry system, which carries the substrate 9, is provided in such a way that as to penetrate the plurality of chambers 11, 2, 3 and 12. In addition, gate valves 10 are provided between the chambers 11, 2, 3 and 12.

The substrate 9 is carried in sequence through the chambers by the carry system in a state in which it is mounted on a tray 91, wherein the processing is performed. One of these plurality of chambers is a load-lock chamber 11 which opens to the atmosphere when the substrate 9 is carried in, and the other is a load-lock chamber 12 which opens to the atmosphere when the substrate 9 is carried out. Several of the remaining chambers are chambers for processing (hereinbelow, processing chambers) 2. In addition, a chamber 3, provided between the processing chamber 2 and the load-lock chamber 11 or unload-lock chamber 12, constitutes a pressure-adjustment chamber. As there is a large pressure difference between the load-lock chamber 11 (or unload-lock chamber 12) and the processing chamber 2, the pressure adjustment chamber 3 maintains and adjusts the atmosphere to an interim pressure there-between.

As shown in FIG. 9, the configuration of the carry system enables the movement of the tray 91, on which the substrate 9 is mounted, by the use of carry rollers 41. These carry rollers 41 constitute a pair of small disk-shaped members provided at both ends of a rotating shaft extending perpendicular with the direction of carry-in the horizontal direction. The carry system is configured by the provision of, in a predetermined interval in the direction of carry, a large number of groups of rotating shafts and pairs of carry rollers 41. As is clear from FIG. 9, the substrate 9 is carried and processed horizontally.

On the other hand, FIG. 10 shows, as another example of a conventional substrate processing device, a schematic configuration of a cluster tool-type device. The cluster tool-type device is a configuration in which, in the perimeter of a transfer chamber 5 in which a transfer robot 42 is provided in the inner part, load-lock chambers 11 and plurality of processing chambers 2 are provided. In the example shown in FIG. 10, two load-lock chambers 11 are provided. In addition, gate valves 10 are provided between the transfer chamber 5, load-lock chambers 11 and processing chambers 2.

The transfer robot 42 takes out the substrate 9 from one load-lock chamber 11 and transfers it in sequence to the processing chambers. The transfer robot 42, following processing, returns the substrate 9 to the other load-lock chamber 11. It will be noted that, although the load-lock chamber 11 shown in FIG. 10 also comprises the function of the unlock load chamber 12 in the device shown in FIG. 9, the name load-lock chamber is used without alteration.

The transfer robot 42 is a multi-jointed type robot. The substrate is mounted and carried on the tip-end of the arm thereof. To transfer the substrate to a predetermined position the transfer robot 42 performs arm extension and contraction, rotation, and a range of vertical movements. The substrate is mounted and transferred on the arm horizontally. In addition, the substrate is also supported and processed horizontally within the processing chamber 2.

A marked trend of increase in size of the substrates in substrate processing devices of this kind is occurring. By way of example, a full-scale extension of liquid crystal display and plasma display technology to not only the display parts of computers but also wall-hanging type televisions is thought to be just around the corner, and the display area of wall-hanging type televisions is large by comparison to the display area of computers. For this reason, the substrates thereof are also larger. In addition, as a general trend, instances where two or more products are manufactured from one substrate to increase productivity and reduce manufacturing costs has increased and, accompanying this, the substrates have increased in size.

As a result of this increase in size of the substrates, the above-described substrate processing devices of the prior art harbor the following problems, or, it is predicted they will harbor them in the future.

First, in inline-type and cluster tool-type devices of the prior art, the substrate is maintained horizontal during carry and processing. Accordingly, when the substrate size is increased, the occupied space in the horizontal direction of the chambers (hereinbelow referred to simply as occupied area) will increase as a matter of course. As a result, the occupied area of the device increases as a whole.

In addition, in the device of an inline-type device shown in FIG. 9, when the chambers 11, 2, 3 and 12 are increased in size, the length in the line direction is increased. At the present time, in the manufacture of televisions for the home such as wall-hanging type televisions, the processing of a substrate of a size of the order of 1 m×1.2 m is required and, when a device for processing a substrate of this magnitude is configured using an inline-type device, the length in the line direction reaches 10 or more meters.

In addition, in the cluster tool-type device shown in FIG. 10, a size increase of the substrate is linked to an increase in the occupied area of the chambers and leads to an increase in the occupied area of the device as a whole. The most serious problem affecting cluster tool-type devices is a size increase of a transfer chamber 5.

As is clear from the transfer chamber 5 of FIG. 10, even though the center axis for rotational movement of a transfer robot 42 is set in the center of the transfer chamber 5, because the substrate is mounted on the end of the arm thereof, the substrate rotates about the rotating axis in a position eccentric from the center of the transfer chamber 5. Accordingly, the average space required for rotation of the substrate in the horizontal direction (hereinbelow required rotation radius) is twice or more the length of the short side or long side of the substrate. For this reason, there is a doubling of the required rotation radius when the substrate is increased in size, and the transfer chamber 5 is further increased in size. By way of example, where a substrate of the above-described 1 m×1.2 m size is processed, the required rotation radius exceeds 2 m.

Although it is generally necessary for the transfer chamber 5 to be pumped out to a vacuum using a vacuum pumping system, there are problems in that, when the transfer chamber 5 is increased in size, a long time is required to perform pumping to a predetermined vacuum, and the scale of the configuration of the pump system is greater which leads to higher costs. In addition, a transfer chamber 5 such as this is essentially not used in the actual processing of the substrate. The occupation of a majority of the occupied area of the equipment by this component is undesirable in terms of equipment design.

A separate problem resulting from this increase in size of substrates is warp of the substrate during transfer. In display devices such as liquid crystal displays, there is a strong market demand for both an increase in surface display area and for thin films. For this reason, the substrates, while they have increased in size, are not very thick. On the contrary, the trend is for them to be thinner. Citing the above-described example of a size of the order of 1 m×1.2 m, the thickness thereof is of the order of 0.7 mm. Several years ago this was of the order of 0.9 mm.

When the substrate 9 of a size and thinness of this order is carried horizontally and processed, there is a problem of warp of the substrate due to its own weight. By way of example, although, as described, carry is performed by the movement of a tray 91 by carry rollers 41 in an inline-type device, the substrate 9 is liable to sag downward and warp due to the warp of the tray 91 that occurs at sections that are not in contact with the carry rollers 41. In addition, in cluster tool-type equipment as well, the substrate 9 sags downward and warps at sections on both sides that are not in contact with the arm.

When processing is performed in a state in which warp such as this has been generated, the processing is not uniform and there is a fear of imparting damage, such as display blotches, to the performance of the product. In addition, as a result of the non-uniform residual inner stresses on the substrate, there is a fear that damage such as cracks in the substrate will be liable to occur, and of a reduction in reliability of the product.

In addition, in the cluster tool-type devices, the transfer of the increased size substrate using the transfer robot 42 is, in reality, very difficult. That is to say, for the holding of a large substrate, the arm must be of a sufficient size and rigidity. In addition, there is a need to be able to expand and contract, rotate, and move the larger scale arm up and down with high precision, and the production of a movement mechanism such as this, having adequate precision, is very difficult. Accordingly, it is felt that transfer using an articulated robot will have reached its limitations in the not-too-distant future.

A further problem as a result of an increase in size of the substrates is the problem of maintenance.

That is to say, the chambers from which the equipment is configured are, for reasons of maintenance, manufactured so that the inner part can be opened. By way of example, where a transfer error arises within the chamber due to some condition, the operation of the equipment is stopped and the inner part of the chamber is checked. By way of example, where it is discovered that the substrate 9 is not mounted correctly on carry rollers 41 or is not mounted correctly on the arm, the operation of the equipment is restarted after the substrate has been restored to the correct position.

The chambers, for the purpose of maintenance, are provided with an opening/closing door. Normally, the upper plate part of the chamber is fixed by way of a hinge to form the opening/closing door. The reason the upper plate part is used as the opening/closing door is because, by the opening of the opening/closing door, a check of the plate surface of the substrate that constitutes the processing target can be made. The opening/closing door is opened and a check is made with the naked eye as to whether there are any foreign objects or the like on the plate surface of the substrate.

However, when the substrate is increased in size, which leads to an increase in the size of the chambers, the opening/closing door is also increased in size. When the substrate is increased to a size of the order described above, the opening closing door also reaches a size that exceeds a 1 m edge. When the opening/closing door increases in size to this extent, opening and closing is difficult using just the strength of the operator and a large-scale mechanism such as a crane is required.

The application of the present invention, which is designed in order to resolve the above-described problems—resulting from the increase in size of the substrate, has marked technological significance which includes the suppression of increase of occupied area, the resolution of the problem of warp of the substrate, and easier maintenance.

SUMMARY

According to one embodiment of the invention a substrate processing device comprises a plurality of vacuum process chambers, each of which administers a prescribed process to a substrate therein; a through-chamber which constitutes a vacuum chamber, the plurality of vacuum process chambers are hermetically-connected to a perimeter of the through-chamber; a carry system which carries a substrate in sequence, via the through-chamber, to the plurality of vacuum process chambers, the carry system comprises a substrate holder which holds the substrate upright in such a way that a plate surface thereof forms an angle to the horizontal of between 45° and 90°; and a horizontal movement mechanism which moves the substrate holder via the through-chamber to the plurality of vacuum process chambers.

According to another embodiment of the invention, a substrate processing device, comprises a plurality of through-chambers, each of which includes a hermetically-connected vacuum chamber; a plurality of processing chambers that are hermetically-connected to the plurality of through-chambers; a carry system that carries a substrate in sequence to the processing chambers, the carry system comprises a substrate holder which holds the substrate upright in such a way that a plate surface thereof forms an angle to the horizontal of between 45° and 90°; and a horizontal movement mechanism which moves the substrate holder to each of the processing chambers via at least a plurality of the through-chambers.

According to yet another embodiment of the invention, a through-chamber has a perimeter to which a plurality of vacuum processing chambers are hermetically-connected. The through chamber comprises a vacuum chamber; a horizontal movement mechanism including a substrate holder for holding a substrate, the horizontal movement mechanism horizontally moves the substrate holder through the vacuum chamber, and the substrate holder holds the abovementioned substrate upright in such a way that the plate surface thereof forms a holding angle to the horizontal of between 45° and 90°, and a direction altering mechanism which alters the direction of movement of the substrate holder by rotating the substrate holder and horizontal movement mechanism about a vertical rotating axis.

BRIEF DESCRIPTION OF THE DRAWINGS

FIG. 7 is a schematic view for explaining the action of the device of the first embodiment shown in FIG. 1 to FIG. 6.

DETAILED DESCRIPTION OF THE PREFERRED EMBODIMENTS

Figure 1:
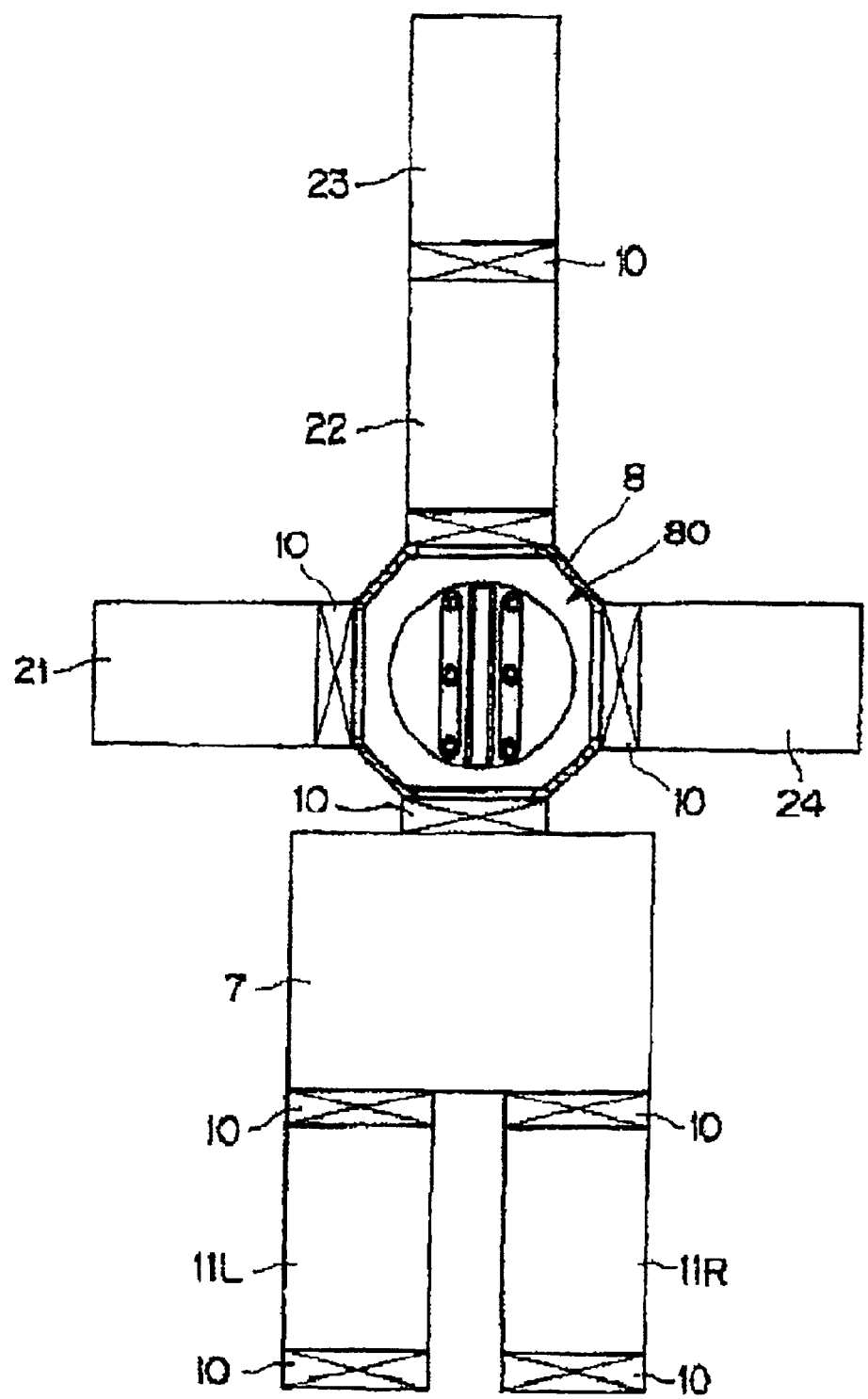
FIG. 1 is a schematic view of a first embodiment of the substrate processing device of the present invention.

With reference to FIG. 1, a description is given of the entire configuration of the preferred embodiment of the substrate processing equipment. FIG. 1 is a schematic view of the preferred embodiment of the substrate processing equipment.

The substrate processing equipment shown in FIG. 1 is a structure in which a plurality of vacuum chambers including processing chambers 21, 22, 23, 24 for administering a predetermined processing to a substrate therein are hermetically-connected. In addition, the equipment comprises a transfer system (not shown in the diagram) for transferring the substrate in sequence to the plurality of vacuum chambers.

Two of the plurality of vacuum chambers are load-lock chambers 11L, 11R with the atmospheric side in which, at times when the substrate is introduced and discharged, the substrate is temporarily retained. Another one of the plurality of vacuum chambers forms a direction-altering chamber 8 that comprises a direction-altering mechanism 80 for altering the direction of transfer of the substrate 9. In addition, the four processing chambers 21, 22, 23, 24 are connected to the perimeter of the direction-altering chamber 8. Furthermore, an intermediate chamber 7 is provided between the direction-altering chamber 8 and the load-lock chambers 11L, 11R.

The chambers 11L, 11R, 21, 22, 23, 24, 7 and 8 are provided with a vacuum pumping system not shown in FIG. 1. The pumping system is preferably configured from a turbo-molecular pump or cryogenic pump and is capable of pumping out to a pressure of the order of $10^{-3}$ to $10^{-5}$ Pa. The chambers 11L, 11R, 21, 22, 23, 24, 7 and 8 are hermetically-connected by way of gate valves 10. A load station not shown in the diagram, which constitutes the position for the mounting of the unprocessed substrate on the substrate holder and collection of the substrate from the substrate holder that has been processed, is provided in the outer side of the load-lock chambers 11L, 11R.

In the preferred embodiment, the substrate is carried and processed while held vertical or at an angle approaching vertical. More specifically, the substrate transfer system comprises a substrate holder which holds the substrate upright in such a way that the plate surface thereof forms an angle of holding to the horizontal of between 45° and 90°, and a horizontal movement mechanism which moves the substrate holder in the horizontal direction whereby the substrate is carried.

Figure 2:
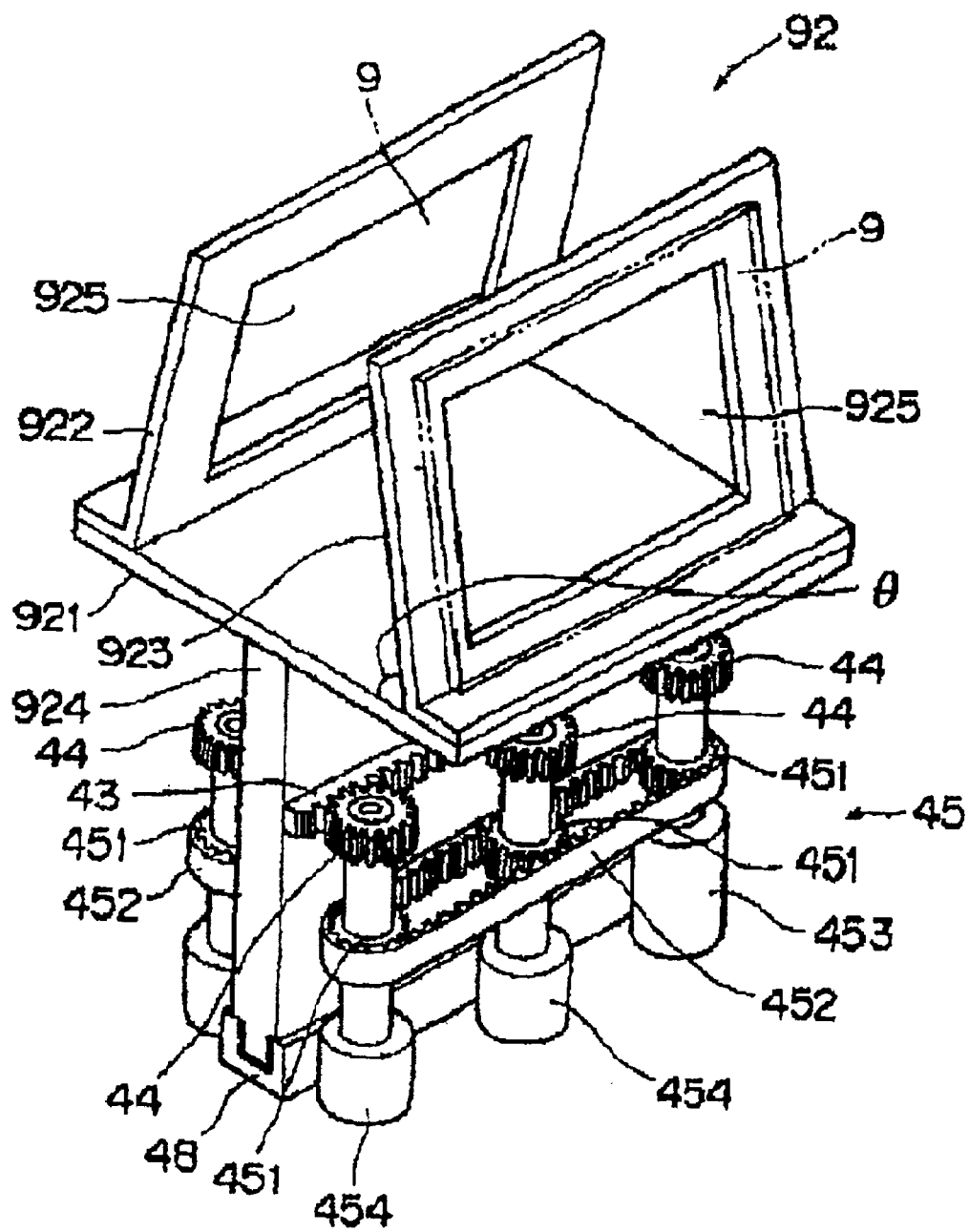
FIG. 2 is a perspective schematic view explaining the configuration of the carry system in the device of FIG. 1.

A description is given, with reference to FIG. 2, of the configurations of the substrate holder and horizontal movement mechanism. FIG. 2 is a perspective schematic view of the configuration of the carry system of the device of FIG. 1.

A substrate holder 92 shown in FIG. 2 is configured principally from a horizontal intermediate plate 921, a pair of receiver plates 922, 923 fixed to the intermediate plate 921, and a support plate 924 extending from below the bottom surface of the intermediate plate 921. The intermediate plate 921 is rectangular (oblong or square). The bottom edge of each of the pair of receiver plates 922, 923 is bent and the section that is bent (hereinbelow the bottom edge part) is fixed along the edge of the intermediate plate 921 and extends upward. The upward-extending sections of the pair of receiver plates 922, 923 (hereinbelow the principal part) face each other and, when viewed from the side, form an arrow tip-shaped character. That is to say, the angle with respect to the horizontal of the principal part of the pair of receiving plates 922, 923 (shown as θ in FIG. 2) is formed to be between 45° and 90°.

As shown in FIG. 2, a rectangular opening 925 is provided in the principal part of the receiving plates 922, 923. It is assumed that a rectangular substrate 9 will be carried and processed in the preferred embodiment. The substrate 9 is slightly larger than the opening 925 of the receiving plates 922, 923. The bottom edge of the substrate 9, as shown in FIG. 2, is mounted on the bottom edge part of the receiving plates 922, 923 and is supported by the receiving plate 922, 923 in a form (in an inclined form) in which the plate surface has contact with the principal part of the receiving plates 922, 923. It will be noted that the substrate 9 is held in a position that blocks the opening 925 of the receiving plates 922, 923.

The upper-edge surface of the support plate 924 is fixed to the center of the bottom surface of the intermediate plate 921 and extends vertically downward. When viewed from the side, a T-shape is formed by the support plate 924 and intermediate plate 921. The direction of the side fixed to the intermediate plate 921 of the support plate 924 is parallel with respect to the edge of the intermediate plate 921, and the upper edge and lower edge of the held substrate 9 are also parallel therewith.

The horizontal movement mechanism, in the preferred embodiment, moves the substrate holder 92 in the horizontal direction using a rack and pinion mechanism. More specifically, a rack 43 is provided on the side surface of both sides of the support plate 924. The direction in which the rack 43 extends is the horizontal direction, and is coincident with the direction of the side of the above-described intermediate plate 921.

The longitudinal movement mechanism is configured from a plurality of pinions 44 that engage with the above-described rack 43, and a pinion drive mechanism 45 that drives the pinions 44. The pinion drive mechanism 45 is principally configured from drive gears 451 linked to each pinion 44 by way of a drive shaft, a timing belt 452 which spans the drive gears 451, a motor 453 linked with one drive gear 451, and a bearing 454 which receives the drive shaft of the remaining drive gears 451.

In FIG. 2, when the motor 453 is operated, the drive gears 451 are rotated by way of the timing belt 452, and this rotation is transmitted to the pinions 44 by the drive shaft. In addition, the rack 43 is moved directly in the horizontal direction by the rotation of the pinions 44, wherein the support holders 92 are also moved in a straight line, as a whole, in the longitudinal direction. As a result, the substrate 9 held by the substrate holders 92 is carried.

In addition, as shown in FIG. 2, a guide rail 48 is provided which guides the movement of the substrate holder 92 and supports the whole of the substrate holder 92. The guide rail 48 comprises a groove into which the bottom edge of the support plate 924 fits. The guide rail 48 constitutes a long member in the longitudinal direction of the support substrate tools 92. A bearing or the like, not shown in the diagram, is provided in the inner surface of the guide rail 48 which affords the smooth movement of the bottom edge of the support plate 924. It will be noted that the adoption of a magnetic levitation mechanism is suitable because, if the bottom edge of the support plate 924 and the guide rail 48 do not contact, the generation of dust and dregs and so on will be minimized.

The above-described horizontal movement mechanism is provided in the left and right load-lock chambers 11L, 11R, the intermediate chamber 7, the direction-altering chamber 8, the processing chambers 21, 22, 23, 24 and the load station not shown in the diagram. By the drive of the pinions 44 by the pinion drive mechanism 45 at these respective places, the substrate holder 92 is moved in the lengthwise direction of the rack 43 whereby the substrate 9 is moved in the sequence of load station, load-lock chambers 11L, 11R, intermediate chamber 7, direction-altering chamber 8 and processing chambers 21, 22, 23, 24.

Figure 3:
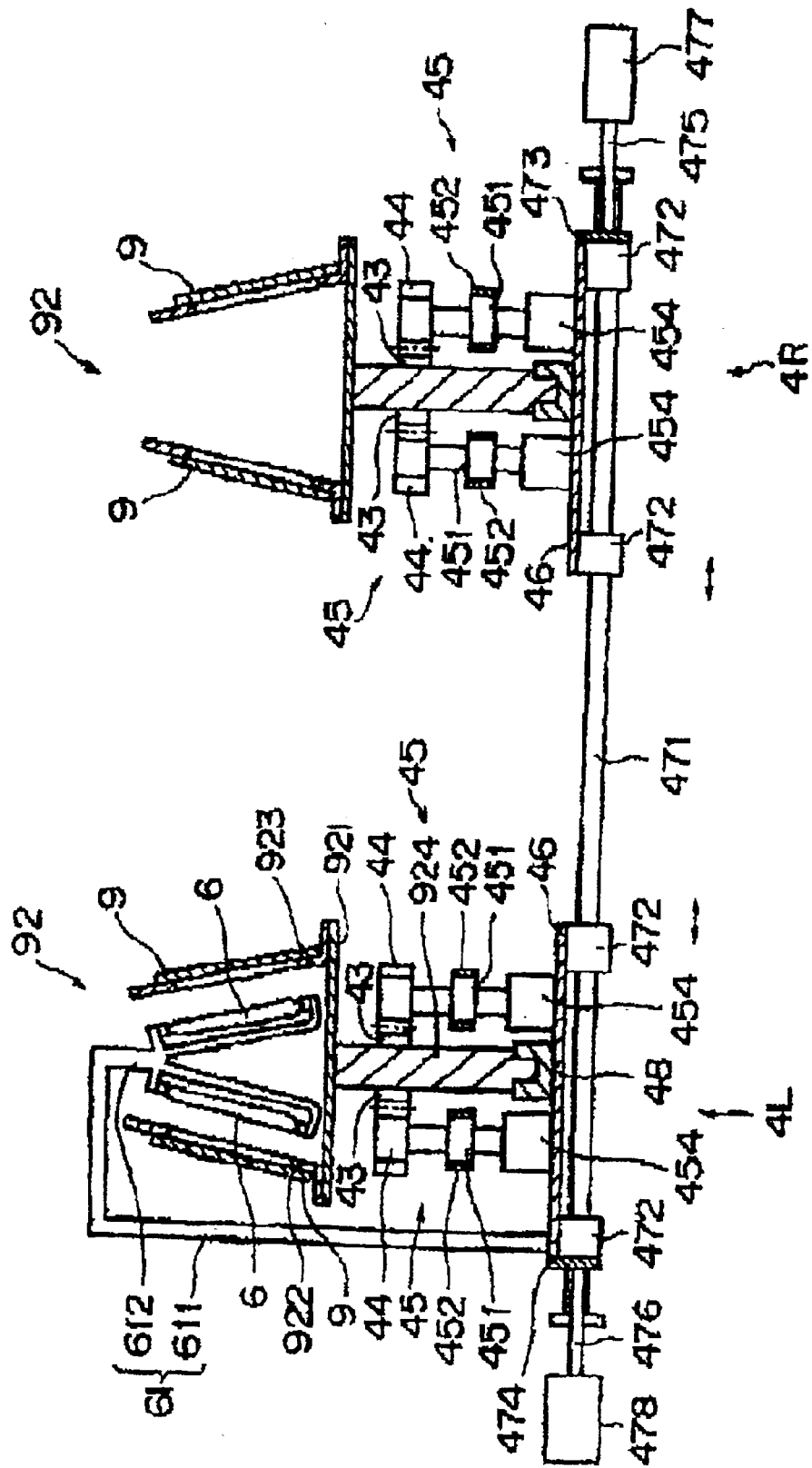
FIG. 3 is a front schematic view showing the configuration of the carry system in the intermediate chamber shown in FIG. 1.
Figure 4:
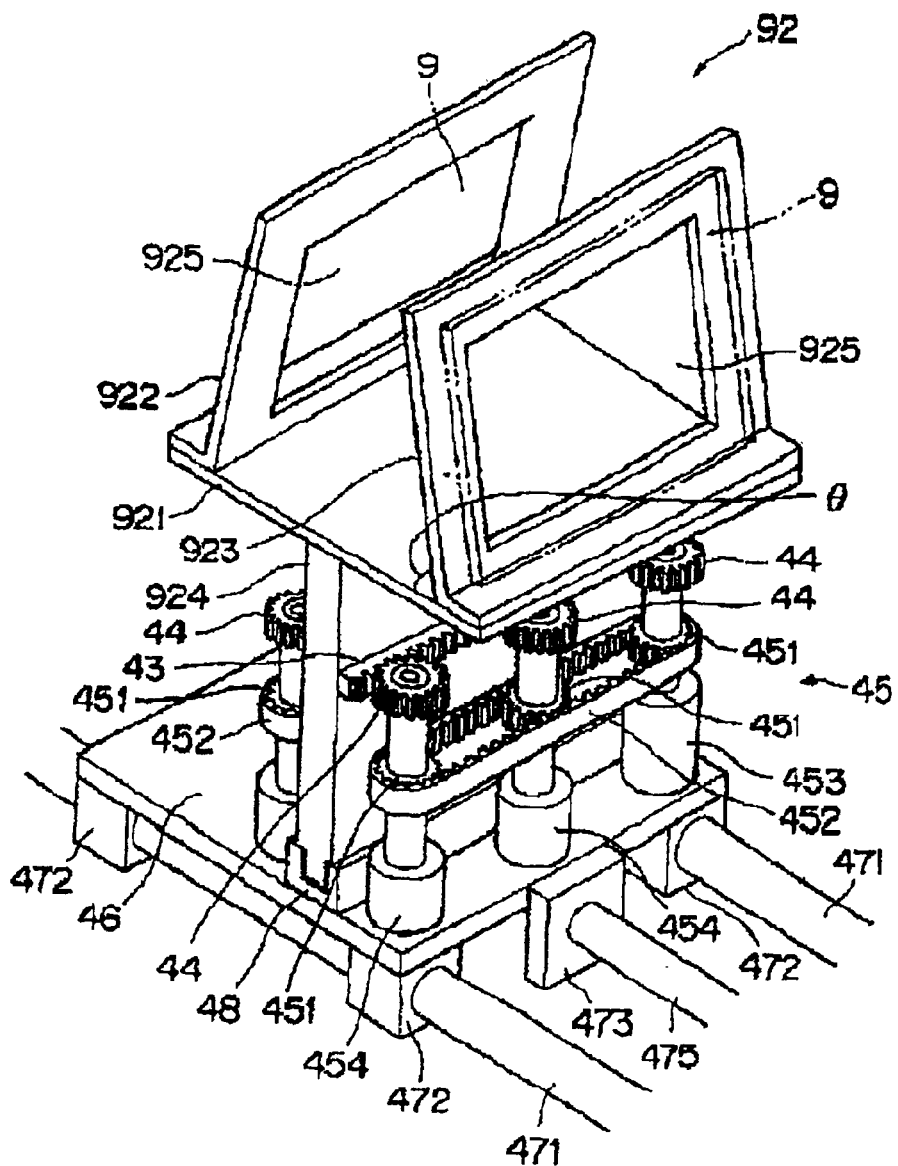
FIG. 4 is a perspective schematic view of the horizontal movement mechanism provided in the intermediate chamber 7 shown in FIG. 1.

In the description below, the horizontal direction which connects the load-lock chambers 11L, 11R and the intermediate chamber 7 is referred to as the first direction. The carry system, in addition to carrying in the first direction in the intermediate chamber 7, is able to carry the substrate 9 in a second direction which constitutes the horizontal direction perpendicular to the first direction. A description of this point is given below with reference to FIG. 3 and FIG. 4. FIG. 3 is a front-surface schematic view showing the configuration of the carry system in the intermediate chamber 7 shown in FIG. 1, and FIG. 4 is a perspective schematic view of the horizontal movement mechanism provided within the intermediate chamber 7 shown in FIG. 1.

As shown in FIG. 3, two groups of pinions 44, pinion drive mechanisms 45 and guide rails 48 are provided at the left and right within the intermediate chamber 7. Base plates 46, fixed to the upper surface thereof, are provided in each of these groups of pinions 44, pinion drive mechanisms 45 and guide rails 48. The base plates 46 are formed horizontally and are provided in the same horizontal plane. The right-side pinion 44, pinion drive mechanism 45, guide rail 48 and base plate 46 group shown in FIG. 3 (hereinbelow, right-side horizontal movement mechanism 4R) and the left-side pinion 44, pinion drive mechanism 45, guide rail 48 and base plate 46 group (hereinbelow left-side horizontal movement mechanism 4L), have essentially the same configuration. It will be noted that FIG. 4 shows the right-side horizontal movement mechanism 4R in FIG. 3.

As shown in FIG. 3, guide rods 471 are provided in the bottom side of the base plates 46 of both horizontal movement mechanisms. As shown in FIG. 4, two guide rods 471 are provided in parallel with the interval therebetween being slightly shorter than the width of the base plates 46. In addition, linear bearings 472, in which the guide rods 471 are inserted, are provided in the bottom surface of the base plates 46. The linear bearings 472 are provided in the base surface of the base plates 46 at the four corners thereof.

In addition, as shown in FIG. 3, a right-side drive rod 475 is fixed by way of a right-side fixing plate 473 to the right edge of the base plate 46 of the right-side horizontal movement mechanism 4R, and a left-side drive rod 476 is fixed by way of a left-side fixing plate 474 to the left edge of the base plate 46 of the left-side horizontal movement mechanism 4L. A right-side straight-line drive source 477 such as an air cylinder is connected to the right-side drive rod 475, and a similar left-side straight-line drive source 478 is connected to the right-side drive rod 476.

When the right-side straight-line drive source 477 is operated, the whole of the right-side horizontal movement mechanism 4R, while guided by the guide rod 471, is moved in a straight line in the lateral direction by way of the right-side guide rod 475. As a result, the substrate holder 92 on the right-side vertical drive mechanism 4R is also integrally moved, and the substrate 9 supported on the substrate holder 92 is carried in this direction. In addition, when the left-side straight-line drive source 478 is operated, the whole of the left-side horizontal movement mechanism 4L, while being guided by the guide rod 471, is moved in a straight line in the lateral direction by way of the left-side drive rod 476. As a result, the substrate holder 92 on the left-side horizontal movement mechanism 4L is integrally moved, and the substrate 9 held on the substrate holder 92 is carried in this direction.

The direction of carry of the substrate 9 at this time is coincident with the direction in which the guide rod 471 extends. As is clear from the above description, the direction in which the guide rod 471 extends in the horizontal direction (hereinbelow second direction) and is perpendicular to the first direction. That is to say, the substrate 9 is able to be carried in both the first direction and the second direction in the intermediate chamber 7.

In addition, in the preferred embodiment, prior to the processing within the processing chambers 21, 22, 23, 24, the substrate 9 is heated to a predetermined temperature in advance by a heater 6 within the above-noted intermediate chamber. In the preferred embodiment, a ceramic heater is used as the heater 6. The ceramic heater is a panel type heater and is provided at an incline, so as to be parallel with the substrate 9 held by the substrate holder 92.

The heater 6, as shown in FIG. 3, is attached to the base plate 46 of the left-side carry mechanism 4L by a heater attachment 61. The heater attachment 61 comprises a support part 611 fixed to the upper surface of the base plate 46 of the left-side carry mechanism 4L, and a heater attachment part 612 provided in the end of the support part 611. As shown in FIG. 3, the upper side of the support part 611 is bent horizontally, and the heater attachment part 612 is formed at end thereof.

The heater attachment part 612 holds the panel-type heater 6 vertical. The heater attachment 61 houses, in an inner part, a cable for connecting the heater 6 with a heater power source not shown in the diagram. It will be noted that, in FIG. 3, the heater attachment part 612, which is symmetrical at the left and right, holds the heater 6 at both the left and right. Accordingly, two substrates 9 can be heated simultaneously. In addition, the opening 925 described above is provided in the receiving plates 922, 923 of the substrate holder 92, so that sufficient radiation from the heater 6 reaches the substrate 9.

Figure 5:
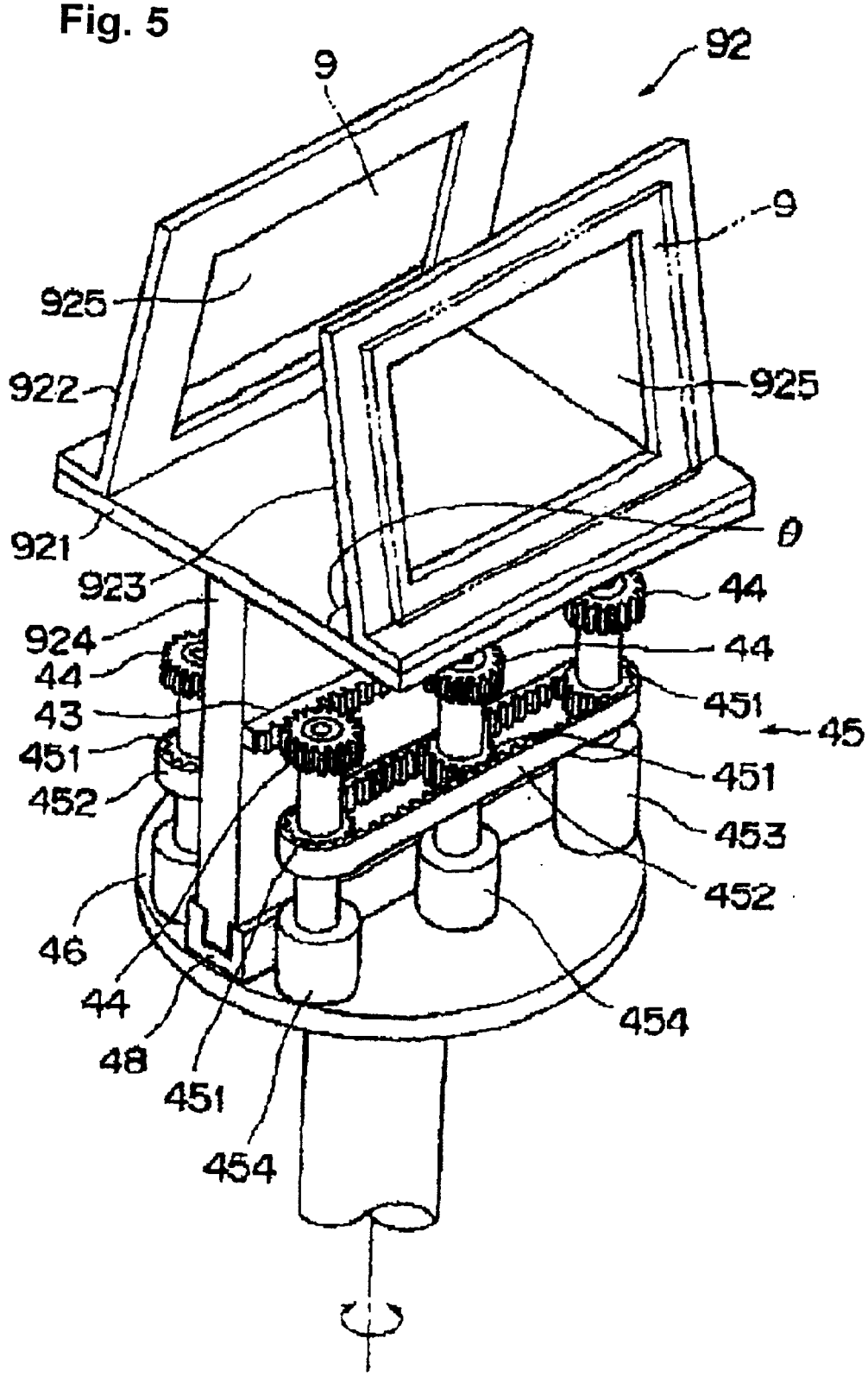
FIG. 5 is a perspective schematic view of the horizontal movement mechanism and direction-altering mechanism provided within the direction-altering chamber 8 shown in FIG. 1.
Figure 6:
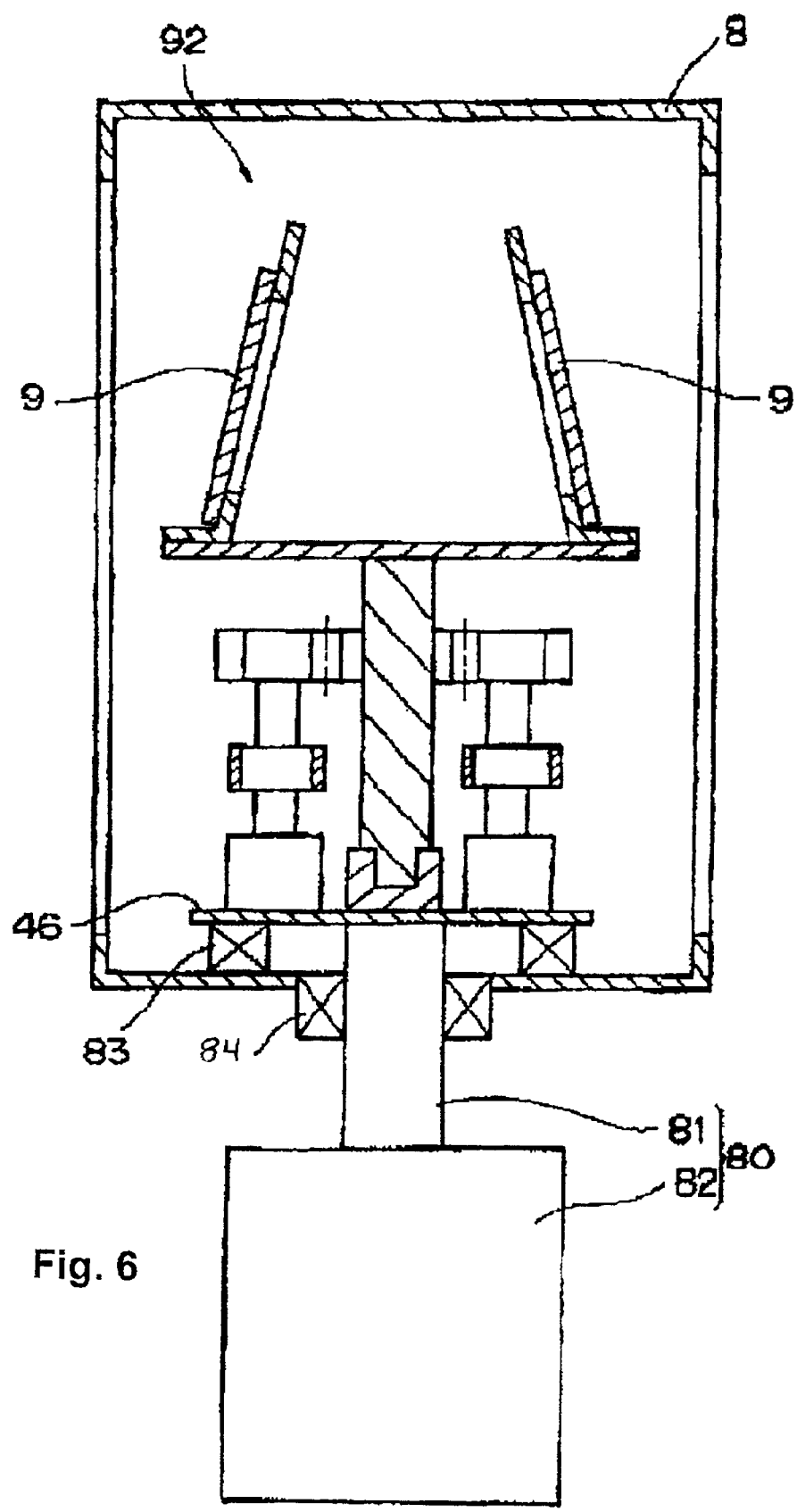
FIG. 6 is a front-cross-sectional schematic view of the direction-altering chamber shown in FIG. 1.

Next, with reference to FIG. 5 and FIG. 6, a description will be given of the configuration of the direction-altering chamber 8. FIG. 5 is a perspective schematic view of the horizontal movement mechanism and direction-altering mechanism provided in the direction-altering chamber 8 shown in FIG. 1, and FIG. 6 is a front-surface cross-sectional schematic view of the direction-altering chamber 8 shown in FIG. 1.

As shown in FIG. 5, the whole of the horizontal movement mechanism within the direction-altering chamber 8 is also held by a horizontal base plate 46. The base plate 46 within the direction-altering chamber 8 is a disk shape as shown in FIG. 5. As is clear from FIG. 5 and FIG. 6, the guide rail 48 is formed in the radial direction of the base plate 46 (that is to say, the direction passing through the center of the base plate 46). In addition, as is clear from FIG. 6, the center axis of the base plate 46 is coincident with the center axis of the direction-altering chamber 8.

A direction-altering mechanism 80 is configured from a rotating drive axis 81 formed in the center of the bottom surface of the base plate 46, and a rotating drive part 82 for rotating the rotating drive axis 81. The rotating drive axis 81 extends vertically through a floor plate part of the direction-altering chamber 8, and a rotating drive part 82 is provided at the bottom end thereof. The rotating drive part 82 comprises a drive source such as a motor, or power transmission mechanism such as a belt. A vacuum seal 84 such as a mechanical seal that employs a magnetic fluid is provided in the penetration part of the rotating drive axis 81.

When the rotating drive axis 81 is rotated by the rotating drive part 82, the whole of the horizontal movement mechanism on the base plate 46 is rotated. At this time, the rotating axis is coincident with the center axis of the base plate 46 and, accordingly, is coincident with the center axis of the direction-altering chamber 8. It will be noted that a bearing 83 is provided between the floor plate part of the direction-altering chamber 8 and the base plate 46. The bearing 83 permits rotation of the base plate 46 while supporting the base plate 46.

As shown in FIG. 6, the substrate holder 92 moves within the direction-altering chamber 8 that holds the substrate 9 and is stopped in the guide rail 48. In this state, when the rotating drive part 82 is operated, the horizontal movement mechanism and substrate holder 92 are integrally rotated. The rotating drive part 82 stops rotating at a position in which the guide rail 48 faces either of the processing chambers 21, 22, 23, and 24. When rotation has stopped the guide rail 48 faces the direction that connects the center axis of any of the processing chambers 21, 22, 23, 24 and the center axis of the direction-altering chamber 8.

The configuration of the four processing chambers 21, 22, 23, 24 is optimized in accordance with the details of the processing to be performed on the substrate 9. By way of example, where a film is to be deposited by sputtering, a target is provided by exposure of the surface to be sputtered within the processing chambers 21, 22, 23 and 24. A pair of targets are opposingly provided to deposit films simultaneously on two substrates 9. It is preferable that the targets be provided on the same axis and parallel with the substrate 9 that is stopped at the predetermined position within the processing chambers 21, 22, 23 and 24. A magnetic unit is provided at the rear of the target to perform magnetron sputtering. A negative direct current voltage or high frequency voltage is imparted to the target while a sputtering gas such as argon is introduced by a gas-introducing system. A sputtering discharge is generated and the target is sputtered, and a thin-film of the material of the sputtered target is accumulated on the surface of the substrate 9.

In addition, the adoption of a configuration for performing film-deposition processing using CVD (chemical vapor deposition) is available. The configuration in this case is a gas-introducing system that introduces a source material gas to be used for film accumulation using a gas-phase reaction. Where plasma CVD is to be performed, a high frequency discharge or the like is generated to form a source material gas plasma and, using the gas-phase reaction within the plasma, a thin film is produced on the surface of the substrate 9. By way of example, where an amorphous silicon film is produced, a gaseous mixture of silane and hydrogen is introduced as the source material gas, and a hydrogenated amorphous silicon film is produced on the surface of the substrate by the plasma CVD. In addition to this, the production of a thin film using heat CVD is also available.

Furthermore, etching-processing is also available. Where etching-processing is performed, a gas that has an etching action such as a fluorine-based gas is introduced. Where plasma etching is performed, the plasma is similarly formed using a high frequency discharge, and etching of the surface of the substrate 9 by active species or ions generated within the plasma is performed.

Next, with reference to FIGS. 7(1) through 7(10), a description will be given of the operation of the entire device of the preferred embodiment pertaining to the above-described configuration. FIGS. 7(1) through 7(10) are plane-surface schematic views for explaining the action of the carry system in the device of the preferred embodiment shown in FIGS. 1 to 6. In FIGS. 7(1) through 7(10), for explanation of the movement of the substrate holder 92 using the carry system, the position of the substrate holder 92 is shown by the single line (straight line or broken line). In addition, for purposes of convenience of explanation, the two load-lock chambers 11L, 11R are referred to as the left-side load-lock chamber 11L and right-side load-lock chamber 11R. Furthermore, the four processing chambers 21, 22, 23, 24 are referred to as the first processing chamber 21, second processing chamber 22, third processing chamber 23 and fourth processing chamber 24.

First, the substrate holder 92 on which two unprocessed substrates 9 are mounted at the load station not shown in the diagram are carried into the left-side load-lock chamber 11L. Next, the substrate holder 92, as shown in FIG. 7(1), is moved into the intermediate chamber 7. More specifically, the left-side drive source 478 shown in FIG. 3 is operated in advance and the left-side horizontal movement mechanism 4L is positioned in alignment, on the same straight line, with the horizontal movement mechanism within the left-side load-lock chamber 11L.

In this state, the horizontal movement mechanism within the left-side load-lock chamber 11L and the left-side horizontal movement mechanism 4L within the intermediate chamber 7 are simultaneously operated and the substrate holder 92 is transferred from the carry mechanism within the left-side load-lock chamber 11L to the left-side horizontal movement mechanism 4L within the intermediate chamber 7. At the point when the substrate holder 92 reaches a predetermined position on the base plate 46 of the left-side horizontal movement mechanism 4L, the operation of the pinion drive mechanism 45 is stopped.

As shown in FIG. 3, the heaters 6 are in a state in which they oppose each other with respect to the substrate 9 held by the substrate holder 92 that has been transferred from the left-side horizontal movement mechanism 4L within the intermediate chamber 7. When the unprocessed substrate 9 is introduced to the intermediate chamber 7 in this way, the heater 6 is operated and the substrate 9 is pre-heated.

When the pre-heating is completed, the left-side horizontal movement mechanism 4L moves the substrate holder 92 to the direction-altering chamber 8. That is to say, the left-side straight-line drive source 478 shown in FIG. 3 is operated again and the substrate holder 92 is moved to a position at the center of the intermediate chamber 7. Meanwhile, in the direction-altering chamber 8, the rotating drive part 82 rotates the horizontal movement mechanism within the direction-altering chamber 8 in advance in such a way that the guide rail 48 of the horizontal movement mechanism within the direction-altering chamber 8 faces the direction which connects the center axis of the direction-altering chamber 8 and the center axis of the intermediate chamber 7.

In this state, the left-side horizontal movement mechanism 4L and horizontal movement mechanism within the direction-altering chamber 8 are simultaneously operated and the substrate holder 92, as shown in FIG. 7(2), is moved within the direction-altering chamber 8. At the same time, the next substrate holder 92 holding an unprocessed substrate 9 is carried into the left-side load-lock chamber 11L.

In addition, the rotating drive part 82 is operated and the direction of the substrate holder 92 is altered within the direction-altering chamber 8 to a position facing the first processing chamber 21. That is to say, it is rotated counter-clockwise 90° as shown in FIG. 7(3). Following this, the horizontal movement mechanism within the direction-altering chamber 8 and horizontal movement mechanism within the first processing chamber 21 are simultaneously operated and the substrate holder 92 is moved into the first processing chamber 21. Processing is performed on the substrate 9 within the first processing chamber 21. At the same time, as shown in FIG. 7(3), the next substrate holder 92 is moved into the intermediate chamber 7 and pre-heating of the substrate 9 is performed in the same way.

When the processing within the first processing chamber 21 has been completed, the substrate holder 92, as shown in FIG. 7(4), is moved to the second processing chamber 22 via the direction-altering chamber 8. That is to say, the horizontal movement mechanism within the first processing chamber 21 and the horizontal movement mechanism within the direction-altering chamber 8 are simultaneously operated and the substrate holder 92 is moved into the direction-altering chamber 8, following which, the rotating drive part 82 is operated to rotate the horizontal movement mechanism counterclockwise 90° within the direction-altering chamber 8. Thereafter, the horizontal movement mechanism within the direction-altering chamber 8 and the horizontal movement mechanism within the second processing chamber 22 are simultaneously operated and the substrate holder 92 is moved into the second processing chamber 22. Following this, processing on the substrate 9 is performed in the second processing chamber 22.

At this time, the next substrate holder 92, as shown in FIG. 7(4), is moved to the center of the intermediate chamber 7. In addition, a further substrate holder 92 is carried into the left-side load-lock chamber 11L.

When the processing within the second processing chamber 22 has been completed, the horizontal movement mechanism within the third processing chamber 23 and the horizontal movement mechanism within the second processing chamber 22 are simultaneously operated and, as shown in FIG. 7(5), the substrate holder 92 moves to the third processing chamber 23. At the same time, the next substrate holder 92 is moved in the same way to the first processing chamber 21 via the direction-altering chamber 8. Thereafter, processing is performed within the third processing chamber and the first processing chamber 21, 23. At this time, the next substrate holder 92 is moved into the intermediate chamber 7 and pre-heating of the substrate 9 is performed.

When processing within the third processing chamber 23 has been completed, as shown in FIG. 7(6), the substrate holder 92 is moved to the fourth processing chamber 24 via the second processing chamber 22 and direction-altering chamber 8. In addition, a further substrate holder 92 is carried into the left-side load-lock chamber 11L.

When processing within the fourth processing chamber 24 has been completed, the substrate holder 92, as shown in FIG. 7(7), is moved via the direction-altering chamber 8 to a center position within the intermediate chamber 7. At this time, the right-side straight-line drive source 477 is operated and the right-side horizontal movement mechanism 4R within the intermediate chamber 7 is moved in advance to transfer the substrate holder 92 to the center position within the intermediate chamber 7.

Following this, as shown in FIG. 7(8), the substrate holder 92 is carried into the right-side load-lock chamber 11R from the left-side horizontal movement mechanism 4R. That is to say, the right-side straight-line drive source 477 is operated and the right-side horizontal movement mechanism 4R is stopped at a position on the same line as the horizontal movement mechanism within the right-side load-lock chamber 11R. Thereafter, the right-side horizontal movement mechanism 4R and left-side horizontal movement mechanism are simultaneously operated and the substrate holder 92 is carried out to the right-side load-lock chamber 11R.

At the same time, the next substrate holder 92, in which the processing within the first processing chamber 21 has been completed, is moved in the same way via the direction-altering chamber 8 into the second processing chamber 22. Next, processing is performed within the second processing chamber 22 on the substrate 9 held by the next substrate holder 92.

The initial substrate holder 92, as shown in FIG. 7(9), is carried out from the right-side load-lock chamber 11R to the load station on the atmospheric side. At the same time, when processing within the second processing chamber has been completed, the next substrate holder 92 is moved to the third processing chamber 23 and processing is performed. In addition, the next substrate holder 92 is similarly moved via the direction-altering chamber 8 to the first processing chamber 21 and processing is performed.

Thereafter, as shown in FIG. 7(10), when processing within the third processing chamber 23 has been completed, the next substrate holder 92 is moved in the same way to the fourth processing chamber 24 and a further substrate holder 92 is moved to the intermediate chamber 7. Hereafter the operation is repeated and the substrate holder 92, via the intermediate chamber 7 and direction-altering chamber 8, is moved in the order of first processing chamber 21, second processing chamber 22, third processing chamber 23 and fourth processing chamber 24 whereby sequential processing on the substrate 9 is performed. It will be noted that, although the gate valves 10 are open during movement of the substrate holder 92, at other times they are closed.

In the above-noted operation, although the left-side lock load chamber 11L is used for carry-in and carry-out of the unprocessed substrate 9, and the lock load chamber 11R is used for carry-in and carry-out of the processed substrate 9, this is not mandatory. Both the left load-lock chamber 11L and the right-side lock load chamber 11R may be employed jointly for carry-in and carry-out of the substrate. However, where transfer of the substrate holder 92 is performed between the left-side horizontal movement mechanism 4L and right-side load-lock chamber 11R, the right-side horizontal movement mechanism 4R must be able to retreat further to the right-side from its position. In addition, where transfer of the substrate holder 92 is performed between the right-side horizontal movement mechanism 4R and left-side load-lock chamber 11L, the right-side horizontal movement mechanism 4L must be able to retreat further to the left-side from its position.

The device of the preferred embodiment pertaining to the configuration and action described above comprises the following noteworthy technological significance.

Firstly, the configuration in which the substrate 9 is carried and processed in a state in which it is held vertical or at an angle approaching the vertical has a marked effect in terms of suppression of increase of occupied area of the device. That is to say, because the substrate 9 is carried and processed in a state in which it is vertical or at an angle approaching the vertical, the occupied space of the load-lock chambers 11L, 11R, intermediate chamber 7 and processing chambers 21, 22, 23 is notably less by comparison to the case in which the substrate 9 is horizontally carried and processed. More particularly, where the substrate 9 is carried and processed horizontally and the substrate 9 is enlarged, the occupied area of the chambers must be enlarged by that amount and, in the preferred embodiment, even though the area in the vertical direction must be increased, essentially, the occupied area is not enlarged. For this reason, the area occupied by the whole device is not enlarged.

There are many instances in which devices such as that of the preferred embodiment are deployed in clean rooms. The increase in the occupied space of the device has a drawback in that it leads to the necessity for a clean room larger by that amount, as well as an increase in working costs and running costs. The device of the preferred embodiment is advantageous in terms of reduction of the work costs and running costs of the clean room because the increase in the occupied space is suppressed.

In addition, the configuration in which the substrate 9 is carried and processed in a state in which it is held vertical or approaching the vertical has noteworthy technological significance in terms of its improvement to the prevention of warp of the substrate 9. That is to say, in the preferred embodiment, because the substrate 9 described above is mounted and held in a state in which it inclines with respect to the substrate holders 92, warp, which occurs when it is held horizontally due to its own weight, does not occur. For this reason, there are no concerns about, for example, performance damage to the product due to non-uniform processing and display blotches, and cracks of the substrate 9 due to non-uniform residual inner stresses.

Furthermore, the configuration in which the substrate 9 is carried and processed in a state in which it is held vertical or approaching vertical has technological significance in that the maintenance of the device is easier. As described above, although it is necessary to provide an opening/closing door for maintenance of the inner part in the chambers from which the device are configured, because the occupied space of the chambers is less, even if the opening/closing door is provided in the upper plate part, the opening/closing door will not be that much larger. In addition, because the plate surface of the substrate 9 faces the side direction, the opening/closing door may be provided in the side plate part of the chamber and, in this case, the opening and closing is easy even if a large opening/closing door is provided.

An angle of holding $\theta$ of the substrate 9 of between 45° and 90° degrees is adopted in the above-described embodiment mode and this is because, when this angle is 45°, or less, this is nearer the horizontal and the technological significance as described above is less likely to be satisfactorily obtained. It will be noted that, although it is more preferable that $\theta$ be an angle in the range of between 70° to 85°, when it is 85° or more it is close to 90° and, in the state in which it leans with respect to the substrate holding part 92, there are concerns that the holding of the substrate 9 will be inadequate. In other words, the possibility that the substrate 9 will fall due to some kind of shock is increased. Although a separate provision of a clamp mechanism or the like which pushes the substrate 9 against the substrate holding 92 is possible in order to prevent this, this has a drawback in that the structure is more complex, and in that the attachment and the detachment operation of the substrate 9 is more complex. In addition, when the angle is increased to be more than 70°, the technological significance of the above-described vertical holding is enhanced.

In addition, because the substrate holder 92 holds two substrates 9 simultaneously and the two substrates 9 can be carried and processed simultaneously, productivity by comparison to the case when a single substrate is held is improved. In this case, it is preferable that the holding angle of the substrate 9 be 60° or above. This is because, when less than 60°, the occupied area in the horizontal direction of two pieces is large by comparison with the occupied area of one piece where the substrate 9 is held horizontal.

In addition, in the configuration of the preferred embodiment in which a direction-altering chamber as described above is adopted, one part of the concept of the chamber layout of a cluster tool-type device is incorporated. That is to say, the concept in which a plurality of vacuum chambers are connected about a through-chamber and the substrate 9 is carried between the vacuum chambers via the through-chamber is adopted. A cluster tool-type device of this kind has merit in that, the freedom of design is high and, as desired, processing chambers or load-lock chambers can be provided around the through-chamber and, in addition, in that it is flexible and able to deal with the alterations in processing. However, it is predicted that, as described above, problems will arise such as an increase in the required rotation radius accompanying an increase in the size of the substrate 9, increase in size of the through-chamber, limits to carry using the transfer robot, and warp of the substrate 9.

On the other hand, in a configuration in which the substrate 9 is held substantially vertically as in the preferred embodiment, because the substrate 9 can be rotated at a position close to the rotating axis, the increase in the required rotation radius is not that large even if there is an increase in size of the substrate 9. Accordingly, the increase in the size of the through-chamber (in the preferred embodiment this is the direction-altering chamber 8) is not that large. In addition, because the configuration is one in which, without the use of a transfer robot in which the substrate is mounted on the tip end of the arm, direction is altered by the rotation of the whole of the horizontal movement mechanism around the vertical rotating axis, problems occurring with the use of the transfer robot such as stiffness of the arm are not experienced. Furthermore, because the substrate 9 is mounted substantially vertically, the problem of warp of the substrate 9 is not likely to occur. Accordingly, the configuration of the preferred embodiment, while utilizing the merits of a cluster tool type device, can be formed in a configuration better able to deal with an increase in size of the substrate 9.

In addition, the substrate 9 within the intermediate chamber 7, in the point that it is able to be moved in a second direction as well as a first direction, has the following technological significance.

Figure 9:
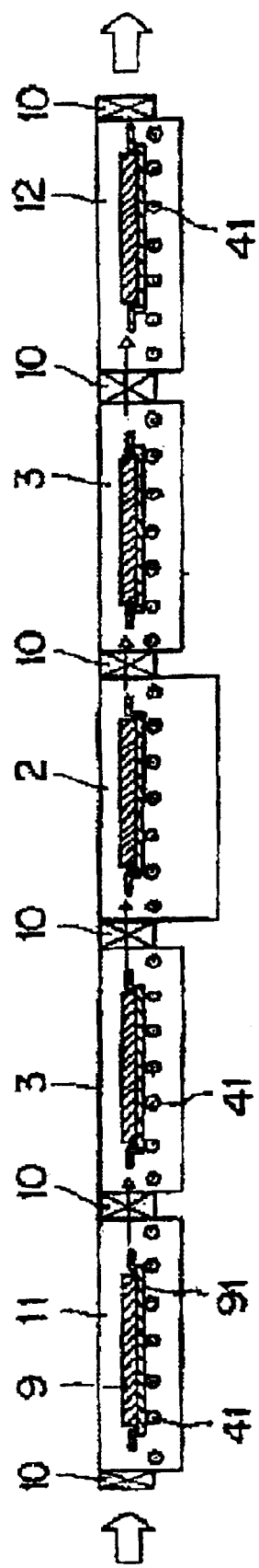
FIG. 9 shows a schematic configuration of a conventional inline-type substrate processing device.
Figure 10:
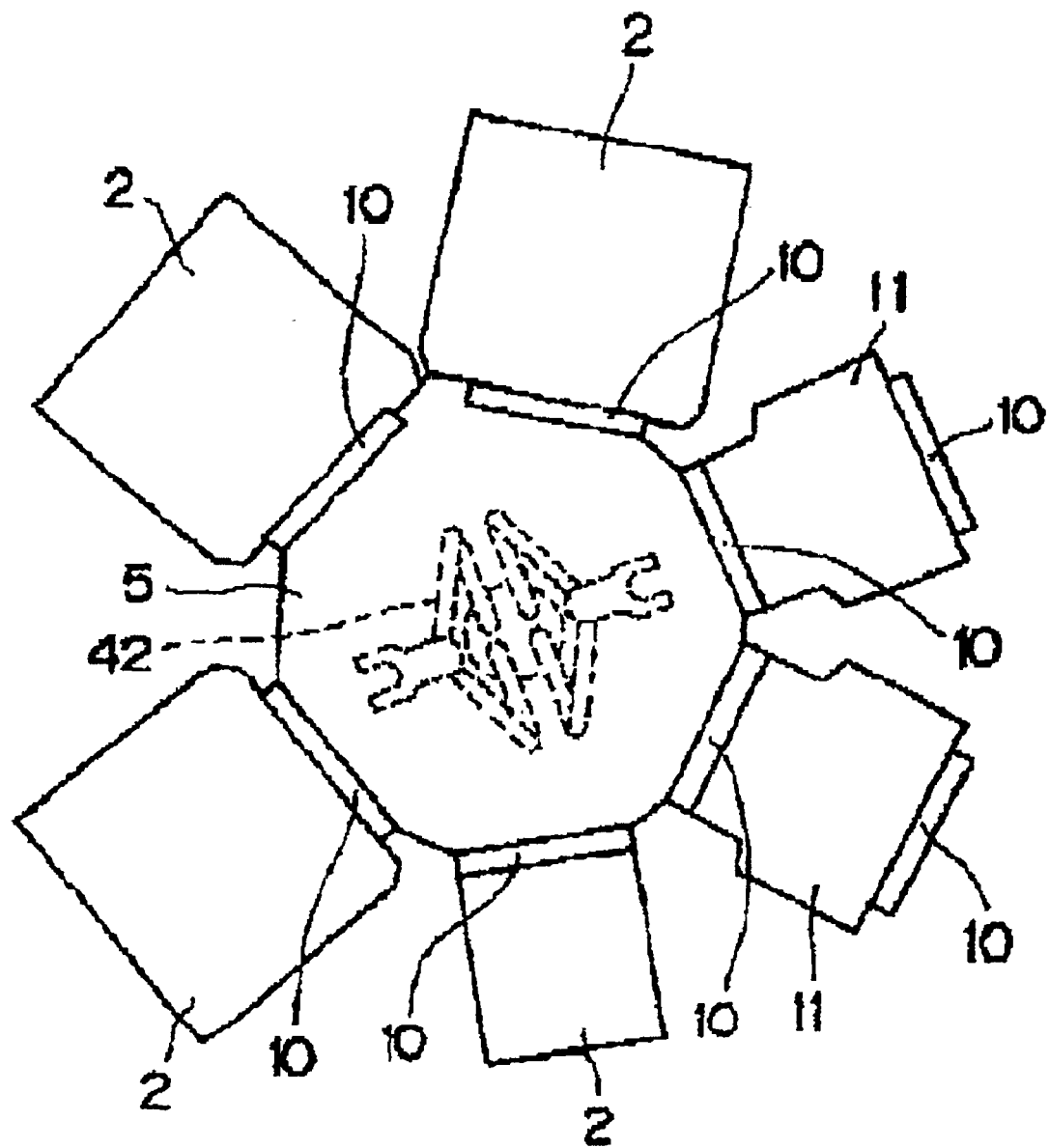
FIG. 10 shows a schematic configuration of a conventional cluster tool-type substrate processing device.

Firstly, in the case where the substrate 9 can only be moved in a first direction, it is not possible to adopt any other layout other than one in which the load-lock chambers 11L, 11R and processing chambers 21, 22, 23, 24 are longitudinally-provided with respect to the intermediate chamber 7. In other words, only the layout of an inline-type device shown in FIG. 9 can be adopted. In this configuration, as is described above, the problem in which an increase in size of the substrate 9 increases the length in the line direction is marked.

However, as in the preferred embodiment, in the case where carry of the substrate 9 in a horizontal second direction perpendicular to the first direction is possible, a plurality of other chambers like the left right load-lock chambers 11L, 11R can be provided in lateral alignment (laterally-provided) with respect to the intermediate chamber 7. For this reason, the number of chambers can be increased without increase to the length in the line direction. This point is particularly effective in cases of different continuous processing and where large numbers of chambers are required because of pressure difference.

In addition, as in the preferred embodiment, the configuration in which the substrate 9 is able to be moved in the secondary direction within the intermediate chamber 7 has marked technological significance in the point that a buffer function is provided to the intermediate chamber 7.

That is to say, when the substrate can be moved in the first direction only, one substrate 9 is carried in and processed in the processing chambers 21, 22, 23, 24 and the carry operation of the next substrate 9 can be performed only after the substrate has been returned along the same path and discharged to the atmospheric side. On the other hand, based on the configuration of the preferred embodiment, the next substrate 9 is carried into the intermediate chamber during processing of the initial substrate 9 in the processing chambers 21, 22, 23, 24, wherein the carry operation of the next substrate 9 to the processing chambers 21, 22, 23, 24 and the processing of the next substrate 9 can be performed during the carry-out operation to the atmospheric side of the initial substrate 9. Accordingly, the productivity is high. It will be noted that the technological significance of this is fundamentally the same even if just one load-lock chamber 11L, 11R is used. Naturally, in the preferred embodiment that comprises two lock chambers 11L, 11R, the efficiency of the carry-in and carry-out operation of the substrate 9 is increased and the productivity is high.

In addition, as is clear from FIG. 2, the direction of movement of the substrate holder 92 by the horizontal movement mechanism is the horizontal direction and is perpendicular to the plate surface of the substrate 9 and the horizontal direction from which the holding angle θ is formed. This configuration is technologically significant in that it reduces the occupied area of the space required for carry in the horizontal direction.

That is to say, where the direction of movement is coincident with the plate surface of the substrate 9 and the horizontal direction from which the holding angle θ is formed, the carry state formed is one in which the plate surface of the substrate 9 faces the rear or front with respect to the movement direction. In this configuration, the width of the space required for carry is equivalent to the width of the plate surface of the substrate 9. Accordingly, the size of the space in the horizontal direction required for carry is larger by comparison to the preferred embodiment. For this reason, an increase in size of the entire body of the device results and the problem is worse when the substrate 9 is increased in size. On the other hand, based on the configuration of the preferred embodiment, a problem of this kind does not arise and the space required for carry in the horizontal direction is minimized.

In addition, the above-described configuration contributes to the simplification of the gate valves 10. That is to say, in a configuration in which the direction of movement is coincident with the plate surface of the substrate 9 and the horizontal direction from which the holding angle θ is formed, a configuration is formed in which the load-lock chambers 11L, 11R and processing chambers 21, 22, 23, 24 are connected to the intermediate chamber 7 at the long side section of the outline of the square thereof. For this reason, the size of the opening for the opening and closing of the gates 10 is enlarged. Accordingly, when, for example, large drive forces for opening and closing are required, the scale of the gate valves 10 is increased. On the other hand, based on the configuration of the preferred embodiment, a problem such as this does not arise and the gate valves 10 can be simplified.

In addition, in the preferred embodiment, a configuration is formed in which the substrate 9 processed within the processing chambers 21, 22, 23, 24 is returned via the intermediate chamber 7 to either of the load-lock chambers 11L, 11R (so-called inter-back type configuration). In this configuration, the carry-in and carry-out of the substrate 9 to the device is performed on the same side. Accordingly, the assembly thereof on existing manufacturing lines is easy.

On the other hand, because the carry-in and carry-out of the substrate to the device 9 in the above-noted inline-type devices is divided into left and right parts, the width between left and right must be opened wider for existing manufacturing lines. Accordingly, in manufacturing lines of limited space, the assembly of the above-described inline-type device is difficult.

As is clear from the description above, in the preferred embodiment, three to four substrate holders 92 are carried simultaneously into the device and, during the processing within the processing chambers 21, 22, 23, 24, a pre-heating of the substrate 9 and carry of the substrate 9 via the left and right load-lock chambers 11L, 11R is performed. Accordingly, the productivity is high.

In addition, in the preferred embodiment, a heater 6 for the pre-heating of the substrate 9 is provided in the intermediate chamber 7 that comprises the buffer function as described above. Accordingly, the special provision of a pre-heating chamber is unnecessary which has technological significance in that the occupied area of the device is reduced and the devices costs are reduced. By virtue of the fact that pre-heating is performed during processing of the previous substrate 9, the lead time is shortened and, by virtue of this point, productivity is also increased.

In addition, a pressure-adjustment chamber function can be provided in the above-described intermediate chamber 7. That is to say, it is preferable that, when the pressure difference between the load-lock chambers 11L, 11R and processing chambers 21, 22, 23, 24 is large, adjustments to and maintenance of the pressure in the center of the intermediate chamber 7 be made. In addition, the fourth processing chamber 24, in accordance with need, can be formed as a cooling chamber for cooling the substrate 9.

It will be noted that, in the above-noted longitudinal movement mechanism configuration, it is preferable that the configuration of the inlet side of a guide rail 48 be such as to be able to easily receive the bottom edge of the support plate 924 of the support holder 92. That is to say, in the longitudinal movement mechanism, although the support holder 92 is moved by transfer from the fore-front side guide rail 48 to the front guide rail 48, if the bottom edge of the support plate 924 does not slot into the front guide rail 48 correctly at this time it leads to carry errors. In order to prevent this, taper should preferably be provided in the side surfaces of the groove on the inlet side of the guide row 48 to enlarge the opening on the inlet side, wherein the bottom edge of the support plate 924 is more easily received.

Although two processing chambers 22, 23 are longitudinally-provided in the above-noted preferred embodiment, the provision of three or more processing chambers is possible. In addition, where problems of atmosphere contamination arise in the two processing chambers 22, 23 due to, for example, the dispersion of gas from within the third processing chamber 23 to the second processing chamber 22, hydraulic exhaust is performed to maintain the pressure within the third processing chamber 23 lower by comparison with the pressure within the second processing chamber 22.

Figure 8:
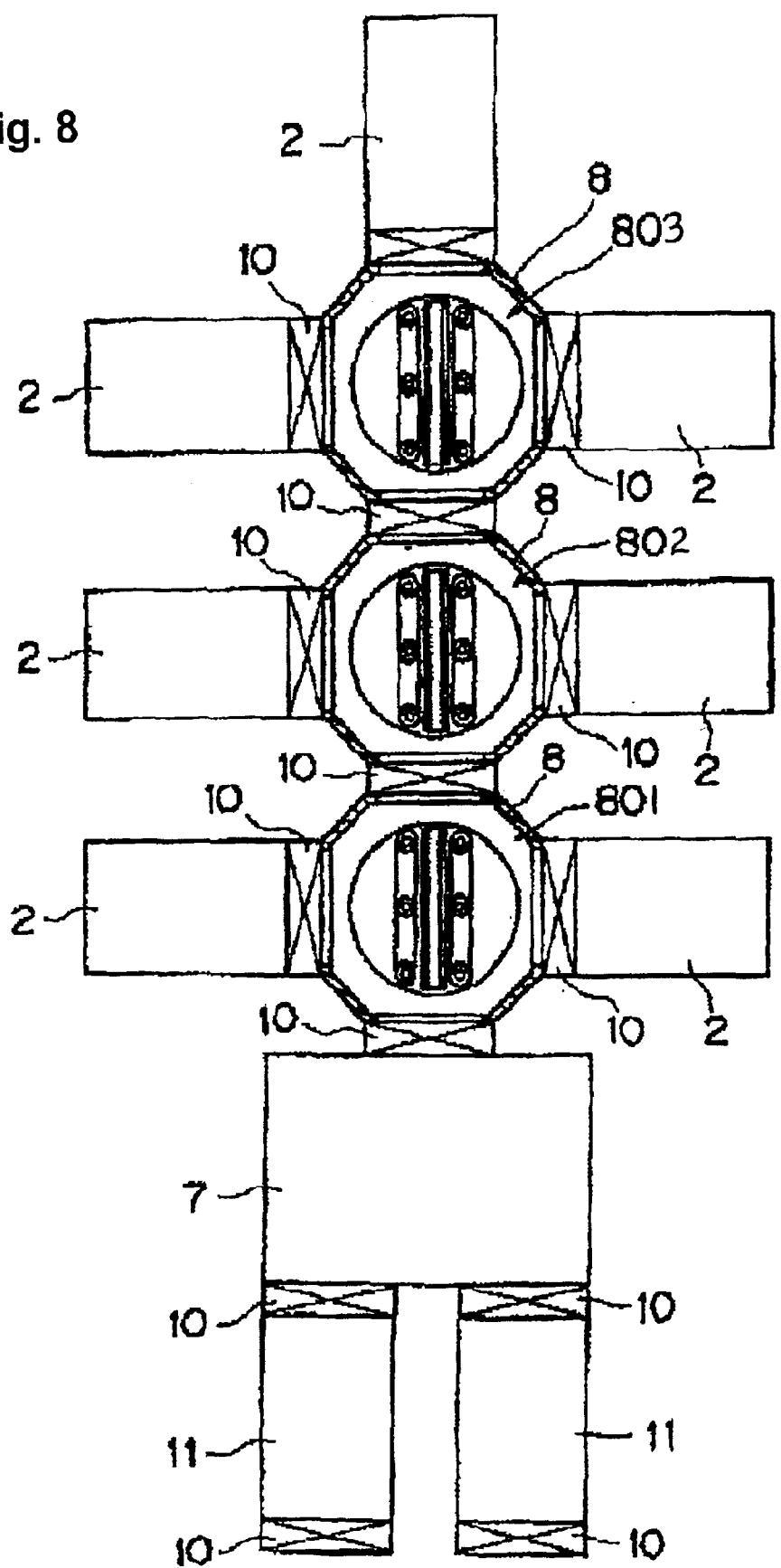
FIG. 8 is a schematic view of a second embodiment of the present invention.

Next, a description will be given of a second preferred embodiment of the invention of this application. FIG. 8 is a schematic view of the second embodiment of the substrate processing device. As shown in FIG. 8, in the substrate processing device of the second embodiment, a plurality of direction-altering chambers (three in this embodiment mode) 801, 802, 803 are longitudinally-provided as in an inline-type device. The configuration of each of the direction-altering chambers 801, 802, 803 is the same as the direction-altering chamber 8 of the first embodiment shown in FIG. 1. When three direction-altering chambers, that is, a first direction-altering chamber 801, a second direction-altering chamber 802 and a third direction-altering chamber 803 are used, the first direction-altering chamber 801 is connected to the intermediate chamber 7 in the same way as the direction-altering chamber 8 of the first embodiment, the second direction-altering chamber 802 is connected to the first direction-altering chamber 801, and the third direction-altering chamber 803 is connected to the second direction-altering chamber 802.

Processing chambers 2 are respectively connected to both sides of the first and second direction-altering chambers 801, 802, and a processing chamber 2 is connected to both sides, as well as the side opposing the second direction-altering chamber 802, of the third direction-altering chamber 803. Accordingly, in the preferred embodiment, seven processing chambers are provided. The carry of the substrate 9 to the processing chambers 2 is performed by the direction-altering chambers 801, 802, 803 in the same way as the above-described first embodiment.

In the configuration of the second embodiment, one part of the concept of the chamber layout of the above-described inline-type device is incorporated. However, in this embodiment, the direction-altering chambers 801, 802, 803 are longitudinally-provided without the longitudinal provision of the processing chambers 2 in a line, and the processing chambers 2 are connected to the direction-altering chambers 801, 802, 803. Accordingly, a large number of processing chambers can be provided without a large increase in length in the line direction.

In the above-noted embodiments, although the horizontal movement mechanism for moving the substrate holder 92 in the horizontal direction uses a rack and pinion mechanism, this is not limited thereto. By way of example, a large number of driver rollers that rotate about a vertical axis may be provided along the horizontal direction wherein the drive rollers are contacted with an appropriate friction force to both side surfaces of the support plate 924. If both sides of the drive rollers are simultaneously rotated in the reverse direction, the substrate holder 92 can be moved in a straight line in the horizontal direction. In addition, the mechanism may be one in which a lead-like member such as wire, for dragging the substrate holder 92, is provided in the front and rear ends respectively of the substrate holder, wherein movement is performed by the pulling of either of the lead-like members using a winding mechanism or the like.

In addition, in another embodiment of the invention, the adoption of a direction-altering chamber 8, as described above as a through-chamber, is not a requirement. That is to say, carry of the substrate 9 via the through-chamber is possible without rotation of the substrate holder 92. By way of example, the substrate holder 92 is set to continuously face in the second direction, and the substrate holder 92 may move between the processing chambers 21, 22, 23, 24 in this state. In this case, for the carry across the through-chamber and the carry between the intermediate chamber 7 and the through-chamber, in the same way as the horizontal movement mechanism within the intermediate chamber 7 described above, a mechanism can be adopted in which the whole of the horizontal movement mechanism, while guided by the guide rail, is moved in a straight line. However, the configuration in which the horizontal movement mechanism is rotated integrally with the substrate holder 92 has merit in that it is structurally simple, and in that the direction-altering chambers 8 can be compacted.

In addition, the configuration in which the direction-altering mechanism 80 rotates the horizontal movement mechanism and substrate holder 92 around a rotation axis coincident with the center axis of the direction-altering chamber 8 has technological significance in that it reduces the required radius of rotation and, accordingly, it has technological significance in that the direction-altering chamber 8 is further compacted.

In another embodiment of the invention, the direction-altering chamber 8 can be sold independently.

That is to say, the concept of the chamber layout of the cluster tool-type device was generated from the concept that it would enable, for example, the unification of different device manufacturers or different processes, and the combination of independent process modules in device manufacturers (see Japan Semiconductor Manufacturing Device Society, Dictionary of Terminology Semiconductor Manufacturing Devices Vol. 2, page 131 Published by Nikkan Kogyo Shinbum Co., Ltd.). Accordingly, it is hypothesized that device manufacturers will independently purchase the direction-altering chamber 8 in which the horizontal movement mechanism and a direction-altering mechanism 80 are built, and connect them with the processing chambers of different device manufacturers or connect them with processing chambers developed independently.

In such cases, by the adoption of the direction-altering chamber 8 of the configuration described above, the effects are obtained whereby, as well as suppression of an increase of the occupied area, the resolution of the problem of warp of the substrate, and easier maintenance, an increase in the number of processing chambers is also possible without increase in the length of the line.

It will be noted that examples of the substrate 9 processed in the present invention include semiconductor wafers for semiconductor device manufacture, substrates for display devices such as liquid display or plasma display, substrates for information recording mediums such as hard disk, and substrates for printed wiring plates.

As is described above, because processing is performed as the substrate is carried in a state in which it is vertical or an angle approaching vertical, marked effects in suppression of increase of the occupied area, resolution of the problem of warp of the substrate, and easier maintenance are obtained. In addition, because a plurality of vacuum chambers comprising processing chambers are hermetically-connected in the perimeter of the through-chamber, even if the number of vacuum chambers is increased, there is no increase in length in a specific direction as occurs in an inline-type device.

In addition, if the processing chambers are connected respectively to the perimeter of a plurality of longitudinally-provided through-chambers, the number of processing chambers can be increased, and, in this case as well, there is no increase in length in a specific direction as occurs in an inline-type device.

In addition, if the through-chamber is a direction-altering chamber comprising a direction-altering mechanism which alters the direction of movement using the horizontal movement mechanism, and the direction-altering mechanism alters the direction of movement by rotating the substrate holder and horizontal movement mechanism around a vertical rotating axis, the structure of the direction-altering mechanism is simplified. For this reason, the direction-altering chambers can be compacted.

In addition, if the direction-altering mechanism rotates the substrate holder and horizontal movement mechanism around a rotating axis coincident with the rotating axis of the direction-altering chambers, the direction-altering chambers can be further compacted.

In addition, if the substrate holder holds two substrates simultaneously, productivity is doubled by comparison to the case where just one substrate is held.

In addition, if the substrate holder holds the substrate at an angle of 60° or above, even if two substrates are held, the occupied area in the horizontal direction is not larger by comparison to when one substrate is held.

In addition, effects are obtained in which in addition to, for example, the resolution of the problem of warp of the substrate and easier maintenance, the number of processing chambers is increased without an increase in the line length.

While the present invention has been described by reference to the above-mentioned embodiments, certain modifications and variations will be evident to those or ordinary skill in the art. Therefore, the present invention is limited only by the scope and spirit of the appended claims.

What is claimed is:

1. A substrate processing device, comprising:
   a plurality of vacuum process chambers, each of which administers a prescribed process to a substrate therein;
   a through-chamber which constitutes a vacuum chamber, the plurality of vacuum process chambers are hermetically-connected to a perimeter of the through-chamber;
   a carry system which carries a substrate in sequence, via the through-chamber, to the plurality of vacuum process chambers, the carry system comprises a substrate holder which holds the substrate upright in such a way that a plate surface thereof forms an angle to the horizontal of between 45° and 90°;
   a horizontal movement mechanism which moves the substrate holder via the through-chamber to the plurality of vacuum process chambers; and
   an alignment chamber hermetically connected to the through-chamber;
   wherein when the substrate holder is in the alignment chamber, the horizontal movement mechanism is able to move the substrate holder such that a substrate being held in the substrate holder is able to move sideways with respect to a longitudinal direction of the plate surface thereof, as well as in the longitudinal direction thereof so as to align the carry system with the through-chamber; and
   wherein the alignment chamber is arranged between the through-chamber and one or more load-lock chambers.

2. The substrate processing device described in claim 1, wherein the through-chamber constitutes a direction-altering chamber comprising a direction-altering mechanism which alters the direction of movement of the substrate holder using the horizontal movement mechanism, wherein the direction-altering mechanism alters the direction of movement by rotating the substrate holder and the horizontal movement mechanism about a vertical rotating axis.

3. The substrate processing device described in claim 2, wherein the direction-altering mechanism rotates the substrate holder and the horizontal movement mechanism about a rotating axis coincident with a center axis of the direction-altering chamber.

4. The substrate processing device described in claim 1, wherein the substrate holder holds two substrates simultaneously.

5. The substrate processing device described in claim 4, wherein the substrate holder holds the substrates upright in such a way that the plate surface thereof forms an angle to the horizontal of between 60° and 90°.

6. A substrate processing device, comprising:
   a plurality of through-chambers, each of which includes a hermetically-connected vacuum chamber;
   a plurality of processing chambers that are hermetically-connected to the plurality of through-chambers;
   a carry system that carries a substrate in sequence to the processing chambers, the carry system comprises a substrate holder which holds the substrate upright in such a way that a plate surface thereof forms an angle to the horizontal of between 45° and 90°;

a horizontal movement mechanism which moves the substrate holder to each of the processing chambers via at least a plurality of the through-chambers; and an alignment chamber hermetically connected to one of the through chambers;

wherein when the substrate holder is in the alignment chamber, the horizontal movement mechanism is able to move the substrate holder such that a substrate being held in the substrate holder is able to move sideways with respect to a longitudinal direction of the plate surface thereof, as well as in the longitudinal direction thereof so as to align the carry system with the one through-chamber; and wherein the alignment chamber is arranged between the through-chamber and one or more load-lock chambers.

7. The substrate processing device described in claim 6, wherein the through-chambers each constitutes a direction-altering chamber comprising a direction-altering mechanism which alters the direction of movement of the substrate holder using the horizontal movement mechanism, wherein the direction-altering mechanism alters the direction of movement by rotating the substrate holder and the horizontal movement mechanism about a vertical rotating axis.

8. The substrate processing device described in claim 7, wherein the direction-altering mechanism rotates the substrate holder and the horizontal movement mechanism about a rotating axis coincident with a center axis of the direction-altering chamber.

9. The substrate processing device described in claim 6, wherein the substrate holder holds two substrates simultaneously.

10. The substrate processing device described in claim 9, wherein the substrate holder holds the substrates upright in such a way that the plate surface thereof forms an angle to the horizontal of between 60° and 90°.

11. A through-chamber having a perimeter to which a plurality of vacuum processing chambers are hermetically-connected, the through chamber comprising:

a vacuum chamber;

a horizontal movement mechanism including a substrate holder for holding a substrate, the horizontal movement mechanism horizontally moves the substrate holder through the vacuum chamber, and the substrate holder holds the abovementioned substrate upright in such a way that the plate surface thereof forms a holding angle to the horizontal of between 45° and 90°, a direction-altering mechanism which alters the direction of movement of the substrate holder by rotating the substrate holder and horizontal movement mechanism about a vertical rotating axis; and an alignment chamber hermetically connected to the through chamber;

wherein when the substrate holder is in the alignment chamber, the horizontal movement mechanism is able to move the substrate holder such that a substrate being held in the substrate holder is able to move sideways with respect to a longitudinal direction of the plate surface thereof, as well as in the longitudinal direction thereof so as to align the carry system with the through-chamber;

and wherein the alignment chamber is arranged between the through-chamber and one more load-lock chambers.

12. The through-chamber as described in claim 11, wherein the direction-altering mechanism rotates the substrate holder and the horizontal movement mechanism about a rotating axis coincident with-a center axis of the through-chamber.

13. The substrate processing device described in claim 1, further comprising a heater in the alignment chamber.

14. The substrate processing device described in claim 6, further comprising a heater in the alignment chamber.

15. The substrate processing device described in claim 11, further comprising a heater in the alignment chamber.

* * * * *